United States Patent [19]

Berde

[11] 4,446,421
[45] May 1, 1984

[54] APPARATUS AND METHOD FOR LOCATING FAULTS IN CABLES

[75] Inventor: Dennis W. Berde, Plainview, N.Y.

[73] Assignee: Grumman Aerospace Corporation, Bethpage, N.Y.

[21] Appl. No.: 275,608

[22] Filed: Jun. 22, 1981

[51] Int. Cl.³ .......................................... G01R 31/08
[52] U.S. Cl. .................................................. 324/52
[58] Field of Search ..................... 324/52, 60 R, 60 C, 324/51

[56] References Cited

U.S. PATENT DOCUMENTS

| | | |
|---|---|---|
| 1,958,361 | 5/1934 | Estes . |
| 2,120,391 | 6/1938 | Butterfield . |
| 2,551,942 | 5/1951 | Greene . |
| 3,234,459 | 2/1966 | Brazee . |
| 3,358,226 | 12/1967 | Clinton . |
| 3,445,763 | 5/1969 | Harris . |
| 3,751,606 | 8/1973 | Kaiser . |
| 3,800,216 | 3/1974 | Hamilton . |
| 3,842,247 | 10/1974 | Anderson . |
| 3,944,914 | 3/1976 | Simmonds . |
| 4,025,736 | 5/1975 | Chlupsa . |
| 4,041,288 | 8/1977 | Conway . |
| 4,052,694 | 10/1977 | Fredriksson . |

OTHER PUBLICATIONS

Dynatel Corporation: "The Telephone Cable Resistance Fault Locator"–1972.
Dynatel Corporation: "The Telephone Fault Locator for Telephone Plant Service Centers"–1974.

Primary Examiner—Stanley T. Krawczewicz
Assistant Examiner—Jose M. Solis
Attorney, Agent, or Firm—Morgan, Finnegan, Pine, Foley & Lee

[57] ABSTRACT

An apparatus for locating the position of a fault condition in an electrical cable injects a controlled electrical signal into the faulty conductor and uses a second reference conductor to obtain measurements which define the location of the fault condition.

13 Claims, 3 Drawing Figures

APPARATUS AND METHOD FOR LOCATING FAULTS IN CABLES

BACKGROUND OF THE INVENTION

1. Field of the Invention

This invention relates generally to electronic test instruments, and more particularly to a method and apparatus for precisely locating fault conditions in electrical cable harnesses, electronic interface cables and the like having a variety of configurations such as combinations of individual conductors, twisted wire pairs, coaxial cables, individual or multiconductor shielded wires, etc. As employed herein fault conditions include short circuits, high impedance leakage paths up to about 100 megohms and open circuits.

2. The Prior Art

Electrical cable harnesses and electronic interface cables are generally encased in some form of protective sheathing or sleeving, and for use in demanding environments these cables are typically potted or waterproofed. Other types of cables may often be either buried underground or suspended above the ground from poles or towers. Fault conditions sometimes develop requiring repair of the cables or replacement of the faulty portions thereof. As the lengths of cable under investigation may be quite long, for example of the order of hundreds or even thousands of feet, and the fault condition to be located may be anywhere in the entire length, it is important that the fault condition be accurately located. This is especially true in the case of underground cables where a hole must be generally dug to permit access to the faulty portion of the cable.

Known apparatus and methods for locating fault conditions are shown in U.S. Pat. Nos. 3,800,216 to Hamilton and entitled "Cable Fault Locator Apparatus And Method With Reference Voltage Comparison;" 2,551,942 to Greene and entitled "Apparatus For Locating Faults In Electric Circuits;" 2,120,391 to Butterfield and entitled "Measuring Device;" and 1,958,361 to Estes et al. and entitled "Method Of Locating Faults In Cable Conductors." However, these known apparatus and methods have several shortcomings such as being applicable to only one type of fault condition, e.g. short circuits, or requiring manual balancing of circuits and undesirably complicated determinations on the part of unskilled linemen or repairmen.

It is an object of this invention to provide an apparatus and method for rapidly and automatically measuring the length of a cable to be tested and determining the precise location of a fault condition in the cable without requiring undesirably complicated determinations by unskilled linemen or repairmen. The possible faults include shorts, opens, and high impedance leakage paths between conductors.

It is another object of this invention to provide an apparatus and method having the above characteristics and which can perform the desired measurements for cables of varied configuration including a combination of individual conductors, twisted wire pairs, coaxial cables, individual or multiconductor shielded wires, etc.

It is a further object of this invention to provide an apparatus as described above which is compactly constructed and readily portable.

SUMMARY OF THE INVENTION

In accordance with the above recited objectives, the present invention provides an improved apparatus and method for rapidly and automatically determining the precise location of fault conditions in electrical cable harnesses, electronic interface cables and the like having a variety of configurations such as a combination of individual conductors, twisted wire pairs, coaxial cables, individual or multiconductor shielded wires, etc. The faulty conditions which may be located by the subject apparatus and method include shorts, high impedance paths up to about 100 megohms, and opens. The invention also provides an apparatus and method for measuring the length of the cable to be tested.

In accordance with one embodiment of the present invention, an apparatus for locating a short between a first and second conductor disposed adjacent to one another in a cable, the conductors having equal length, comprises: means for grounding one end of the first conductor, means for applying a control signal to the first conductor such that a first voltage $V_a$ exists between the ends of the first conductor and thereupon a second voltage $V_b$ exists between the second conductor and ground potential, there being a path to the second conductor through the fault condition; voltage detector means selectively responsive to the first and second voltages; means for selectively connecting the voltage detector means between the ends of the first conductor to provide a signal $E_a$ which is representative of the first voltage $V_a$, and between the second conductor and ground potential to provide a signal $E_b$ which is representative of the second voltage $V_b$; data input means for providing a signal $E_L$ representative of the length L of the conductors; and processor means responsive to the voltage detector means and the data input means for automatically processing the $E_a$, $E_b$ and $E_L$ signals to provide a signal $E_D$ which is representative of the distance D between the fault condition and the grounded end of the first conductor, said distance D being defined by the relationship:

$$D=(V_b/V_a)L$$

Preferably the apparatus includes means for determining the length L of the cable conductors when this element is unknown. More particularly, in the preferred embodiment the control signal applied to the first conductor is a known current I which is supplied by a current source, preferably a D.C. current source, to the ends of the first conductor. In addition, the apparatus includes data input means for providing a signal $E_R$, which is a representative of the known resistance per unit length R of the first conductor, and a signal $E_I$ which is a representative of the known current I flowing through the first conductor. Also, the processor means is further responsive to the $E_R$ and $E_I$ signals as well as the $E_a$ signal, for providing a signal $E_L$ which is representative of the cable conductor length L, said length L being defined by the following relationship:

$$L=(V_a/RI)$$

Another embodiment of the present invention provides an apparatus for locating an open condition in a first conductor which is disposed adjacent to a second reference conductor, the first and second conductors having equal length L'. The apparatus comprises: means for grounding one end of the second conductor; means for applying a control signal to the first conductor such that a first voltage $v_a$ exists between one end of the first conductor and the second conductor, and such that a second voltage $v_b$ exists between the other end of the first conductor and the second conductor, this means preferably comprising means for applying an A.C. voltage source to the first conductor; voltage detector means selectively responsive to the first and second voltages; means for selectively connecting the voltage detector means between said one end of the first conductor and the second conductor to provide a signal $e_a$ which is representative of the first voltage $v_a$; means for selectively connecting the voltage detector means between said other end of the first conductor and the second conductor to provide a signal $e_b$ which is representative of the second voltage $v_b$; data input means for providing a signal $e_{L'}$ representative of the length $L'$ of the conductors; and processor means responsive to the voltage detector means and the data input means for automatically processing the $e_a$, $e_b$ and $e_{L'}$ signals to provide a signal $e_{D'}$ representative of the distance $D'$ between the fault condition and the grounded end of the second conductor, said distance $D'$ being defined by the relationship:

$$D' = (v_a / v_a + v_b) L'$$

The preferred embodiment of the present invention, in general, combines the elements of the above described embodiments and further includes means for selectively operating either a circuit for locating shorts or high impedance leakage paths or a circuit for locating opens. In addition, in the preferred embodiment of the invention, the entire apparatus is contained in a readily portable housing which includes a visual display that reflects the items entered via the apparatus keyboard, e.g. cable length as well as the desired distance to fault.

DETAILED DESCRIPTION OF THE PREFERRED EMBODIMENTS

Figure 1:
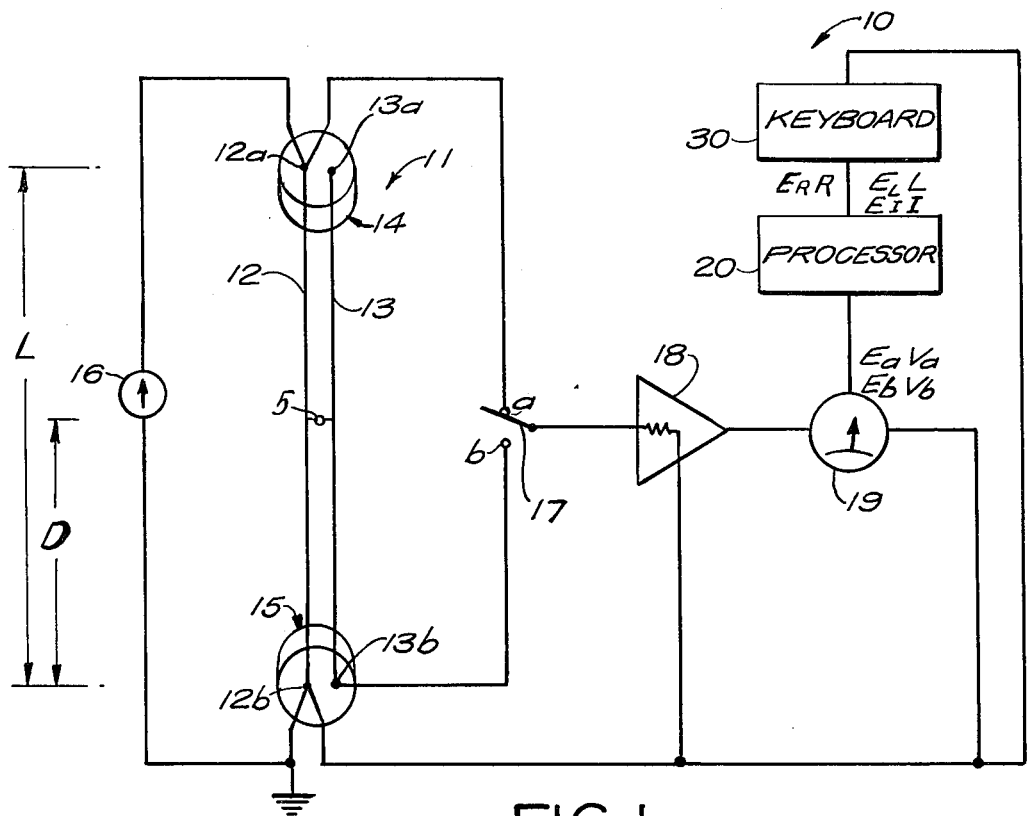
FIG. 1 is a schematic diagram of the apparatus for locating a short or a high impedance leakage path fault condition in accordance with the invention.

Referring to FIG. 1, an apparatus 10 for locating fault conditions such as shorts and high impedance leakage paths in accordance with the invention is schematically depicted. As illustrated, the fault containing cable, which is designated generally by reference numeral 11, includes a pair of conductors 12 and 13 which are disposed adjacent to one another and have a short or high impedance leakage path 5 between them. Conductors 12 and 13 each have a length L and their respective adjacent ends 12a, 13a, 12b and 13b terminate in connectors 14 and 15. It will be noted that while cable 11 is illustrated as including merely a pair of substantially parallel conductors 12 and 13, it is contemplated that the cable may have varied configurations including a combination of more than two individual conductors, twisted wire pairs, coaxial cables, individual or multi-conductor shielded wires etc.

In accordance with the invention, a control signal is applied to conductor 12 by connecting a current source, preferably a D.C. current source 16, to conductor ends 12a and 12b, conductor end 12b having been grounded. A D.C. voltmeter 19, which is driven by a high input impedance operational amplifier 18, is selectively connectable between conductor ends 12a and ground, and between conductor 13 and ground, through fault 5, by a switch 17.

As a result of the applied control signal and because conductor 12 has a well defined resistance which is uniform along the conductor length, a linearly increasing voltage exists in conductor 12, starting at zero volts D.C. at conductor end 12b and having a value of $V_a$ at conductor end 12a when switch 17 is in the "a" position.

Similarly, when switch 17 is in the "b" position a voltage of value $V_b$ exists between conductor 13 and ground, there being a path to ground from conductor 13, through fault 5 and a portion of conductor 12. The voltage $V_b$, which exists throughout conductor 13, is caused by fault 5 and is proportional in value to the distance D that fault 5 is located from cable connector 15.

Because amplifier 18 has a high input impedance, there is negligible current flow through fault 5 and, attendant therewith, a minimal voltage drop across it. As a result, voltmeter 19 can make accurate measurements even for very high leakage resistances in the order of about 100 megohms.

A processor 20 is responsive to voltmeter 19, which provides signals $E_a$ and $E_b$ representative of voltages $V_a$ and $V_b$, respectively, and to a data input member, i.e., keyboard 30, which provides a signal $E_L$ representative of the length L of conductors 12 and 13 when L is known. Processor 20 processes said $E_a$, $E_b$ and $E_L$ signals to provide a signal $E_D$ representative of the distance D from fault 5 to cable connector 15, said distance D being defined by the relationship:

$$D = (V_b / V_a) L$$

When the length L of the conductor to be tested is not known, and thus may not be simply entered via keyboard 30, the subject apparatus may be employed to effect an accurate measurement thereof. More particularly, with reference to FIG. 1, when current source 16 is connected across conductor 12 a known amount of current I flows through conductor 12. With switch 17 placed in the "a" position, voltmeter 19 detects the voltage $V_a$ existing between conductor ends 12a and 12b and provides a signal $E_a$ which is representative of voltage $V_a$ to processor 20. The resistance per unit length R of conductor 12, which is a known quantity, is entered via keyboard 30 along with the known value of the current I flowing through conductor 12. As a result, keyboard 30 provides to processor 20 a signal $E_R$, which is representative of resistance R, and a signal $E_I$ which is representative of the value of current I. Processor 20 processes signals $E_a$, $E_R$ and $E_I$ and provides a signal $E_L$ which is representative of the length L of conductor 12, said length L being defined by the relationship:

$$L = V_a / RI$$

Figure 2:
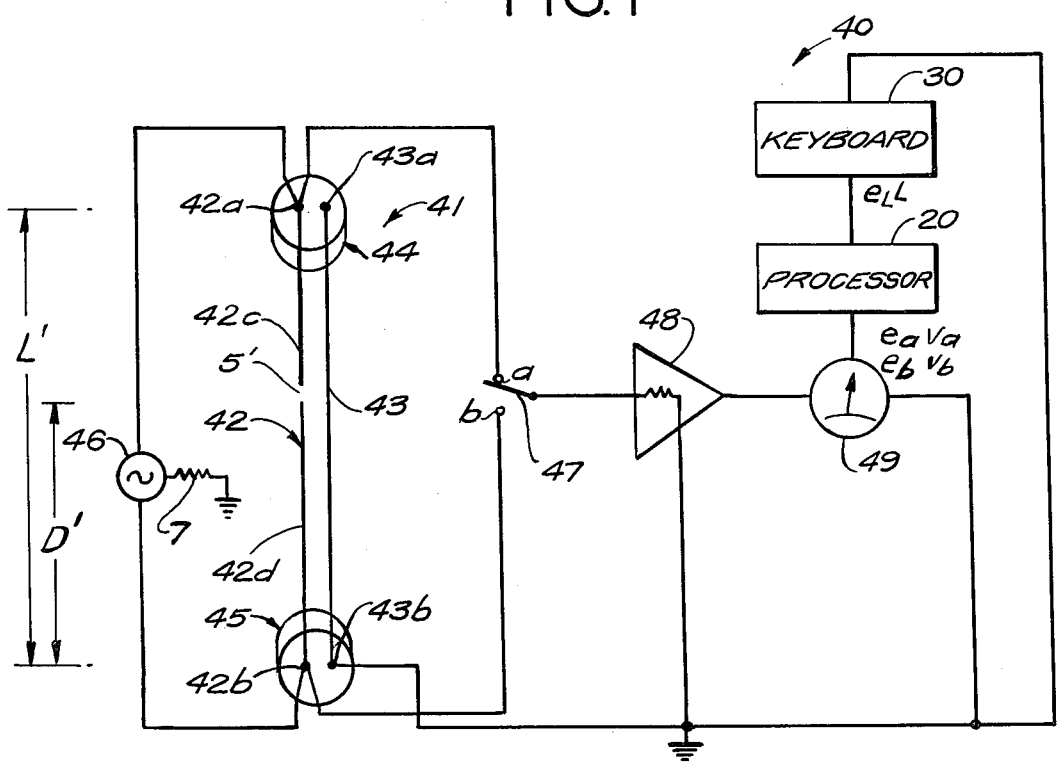
FIG. 2 is a schematic diagram of the apparatus for locating an open fault condition in accordance with the invention.

Turning now to FIG. 2, an apparatus 40 for locating open fault conditions in accordance with the invention is schematically depicted. As illustrated, the fault containing cable, which is designated generally by reference numeral 41, includes a pair of conductors 42 and 43 which are disposed adjacent to one another. Conductor 42 has an open 5' dividing conductor 42 into two spaced apart portions 42c and 42d. Conductors 42 and 43 each have a length L', and their respective adjacent ends 42a, 43a and 42b, 43b terminate in connectors 44 and 45. Again, it will be noted that while cable 41 is illustrated as including merely a pair of substantially parallel conductors 42 and 43 it is contemplated that the cable may be of varied configurations as indicated above.

Conductor portion 42c provides a first interwire capacitance to conductor 43 and conductor portion 42d provides a second interwire capacitance to conductor 43. In accordance with the invention, a control signal is applied to conductor 42 by connecting a voltage source, preferably an A.C. voltage source 46, to conductor ends 42a and 42b, conductor end 43b having been grounded. The applied A.C. signal is divided by said interwire capacitances and conductor 43 provides the ground reference potential. An A.C. voltmeter 49, which is driven by a high input impedance operational amplifier 48, is selectively connected between conductor end 42a and ground, and between conductor end 42b and ground by a switch 47.

A resistor 7 is connected to A.C. voltage source 46 to establish a D.C. reference for the source. Preferably, resistor 7 has a sufficiently high resistance such that it cannot affect the A.C. voltage distribution on conductor portions 42a and 42b which depends only on the respective interwire capacitances of said conductor portions to conductor 43.

Because amplifier 48 has a high input impedance there is only negligible change in the measured A.C. voltages. As a result, voltmeter 49 may obtain accurate measurements even when the respective interwire capacitances, which are proportional to measured voltages $v_a$ and $v_b$, are very small, e.g., about 10 p.F.

As further illustrated in FIG. 2, processor 20 is responsive to voltmeter 49, which provides signals $e_a$ and $e_b$ representative of measured voltages $v_a$ and $v_b$, respectively, and to keyboard 30, which provides a signal $e_{L'}$, representative of the length L' of conductors 42 and 43, for processing said $e_a$, $e_b$ and $e_{L'}$, signals to provide a signal $e_{D'}$, representative of the distance D' from open 5' to cable connector 45.

Because conductor 42 has a capacitance to conductor 43 that is uniformly distributed along the entire length of conductor 42, and because voltages $v_a$ and $v_b$ are proportional to the respective interwire capacitances from conductor portion 42d to conductor 43, and from conductor 42c to conductor 43 the distance D' from connector 45 to fault 5' is defined by the relationship:

$$D' = (v_a/v_a + v_b)L'$$

Figure 3:
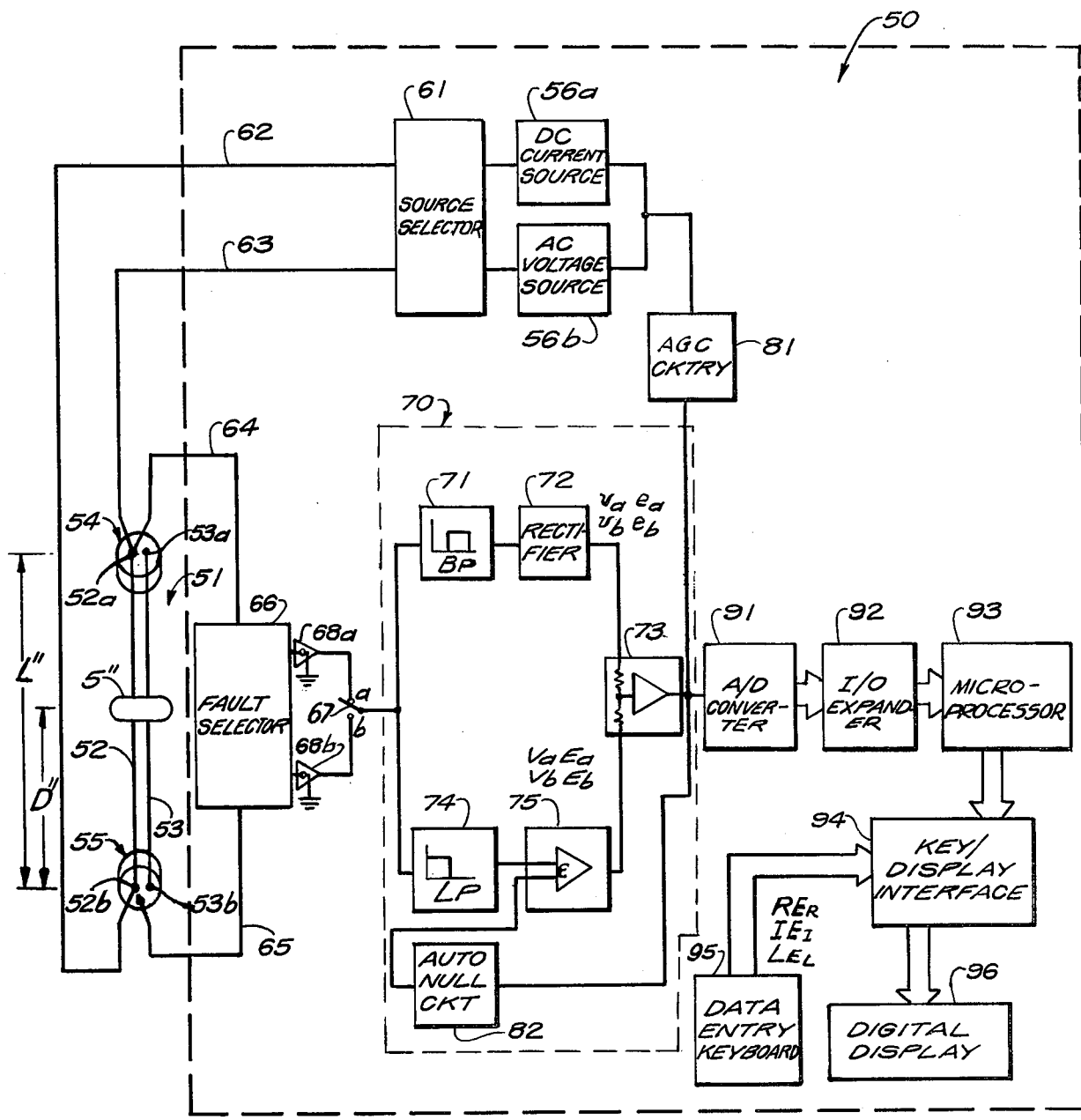
FIG. 3 is a schematic diagram of an apparatus in accordance with the invention which can be selectively operated to locate a short or a high impedance leakage path fault condition or an open fault condition.

Referring now to FIG. 3, an apparatus 50 for locating a short, a high impedance leakage path or an open in a cable member 51, in accordance with the invention, is schematically depicted. As with FIGS. 1 and 2, cable 51 is illustrated as including a pair of adjacently disposed conductors 52 and 53, each having a length L'' and the adjacent ends of each conductor, i.e., 52a, 53a and 53b, 52b being terminated in connectors 54 and 55. Cable 51 may have various configurations, however, as indicated above. Reference number 5'' designates generally the existence of any one of the above mentioned possible faulty conditions in cable 51. It will be understood that when fault 5'' comprises an open in conductor 52, conductor 52 will be divided into a pair of spaced apart conductor portions as discusssed with respect to FIG. 2.

Turning now to the apparatus proper, apparatus 50, in general, combines the features illustrated in FIGS. 1 and 2 and provides means for selectively operating either a circuit for locating a short or high impedance leakage path, or a circuit for locating an open faulty condition. Apparatus 50 also includes additional elements which permit it to provide very quickly and accurately the desired fault location and to measure the cable length L'' when that quantity is not precisely known. It is contemplated that apparatus 50 be constructed in a portable housing having a panel including a data input keyboard 95, a visual display 96, and function control switches 61, 66.

Referring more specifically to FIG. 3, apparatus 50 includes a D.C. current source 56a and an A.C. voltage source 56b, each of which being connected to a source selector means 61, which selectively connects, via test leads 62 and 63, either current source 56a or voltage source 56b to ends 52a and 52b of conductor 52. Typically, source selector 61 may comprise switch means disposed on the operating panel of the apparatus housing for applying current source 56a when the fault to be located is a short or high impedance leakage path between conductors 52 and 53, or voltage source 56b when the fault is an open in conductor 52.

Each of a pair of high imput impedance buffer amplifiers 68a and 68b is selectively connectable, via a fault selector means 66 and sensory leads 64 and 65, to conductor ends 52a, 52b and 53b. The connection depends upon the type of fault to be located as set forth above with respect to FIGS. 1 and 2. Again, fault selector means 66 may typically comprise switch means disposed on the apparatus operating panel. Instead of having separate switches 61 and 66, a single switch may also be employed.

Voltage detector means 70 is selectively connectable to buffer amplifier 68a or 68b by a multiplexor switch 67. Multiplexor switch 67, which is responsive to a microprocessor 93, controls the timing of the pertinent voltage measurements which are required for determining the fault location.

Voltage detector means 70 provides one of two parallel signal paths for processing the input signal selected by multiplexor switch 67, depending upon whether a short (high impedance leakage path) or open is to be located. One signal path is an A.C. signal path comprising band pass filter 71 and rectifier circuit 72. High pass filter 71 blocks and removes any D.C. offset signal such that only the A.C. signal component i.e., the signal representative of the pertinent open locating voltage, ($e_a$ and $e_b$ of FIG. 2), will be processed. The second signal path is a D.C. signal path comprising a low pass filter 74, auto-null circuitry 82 and amplifier 75. Low pass filter 74 blocks and removes any A.C. components of the signal such that only the D.C. signal component, i.e., the signal representative of the pertinent short locating voltage ($E_a$ and $E_b$ of FIG. 1) will be processed.

The auto-null circuitry 82 effectively removes any existing offset signals. Auto-nulling is performed immediately before each voltage measurement. The rectified A.C. signal (open location) and the D.C. signal (short or high impedance leakage path location) use the same buffer amplifier 73. The output of amplifier 73 is routed to an analog to digital converter 91, to an automatic gain control (AGC) circuit 81 and to auto-null circuit 82. The AGC circuit 81 is exercised after the apparatus has been attached to the cable under test and before any received signals are processed. Under control of the AGC circuit 81 the outputs of control signal sources 56a and 56b are such that optimum signal strength is received back from the cable under test, as indicated by the output of buffer amplifier 73.

Analog to digital converter 91 converts each received analog voltage signal, i.e., $E_a$, $E_b$, $e_a$, $e_b$, into digital word format. Each digitized word is sent, via an input/output (I/O) expander 92 to microprocessor 93, which typically comprises a programmable central processing unit, scratchpad memory, and input/output circuitry.

Operator commands to the apparatus are entered via the data entry keyboard 95 which is also preferably located on the instrument front panel. Typically, keyboard 95 is adapted to accept operator commands such as clear display, enter cable length, enter wire gauge, enter wire temperature, determine cable length, and determine distance to fault. Microprocessor 93 processes the respective signals received from voltage detector means 70 ($E_a$, $E_b$, $e_a$, $e_b$), which are modified by analog to digital converter 91 and I/O expander 92, along with the signals received from keyboard 95 ($E_L$, $E_R$, $E_I$) in accordance with the above described relationships to provide the desired fault location. A keyboard/display interface module 94 processes the flow of data between microprocessor 93, data entry keyboard 95, and a visual display 96. Preferably, visual display 96 is digital and is located on the instrument front panel. Its operation is associated with the operation of the data entry keyboard 95. In addition, visual display 96 is responsive to microprocessor 93, via interface member 94, for displaying the desired distance to fault. Preferably, digital display 96 displays the entered parameters as well as the distance to fault and/or cable length.

While there have been described herein what are at present considered preferred embodiments of the invention, it will be obvious to those skilled in the art that many modifications and changes may be made therein without departing from the essence of the invention. It is therefore to be understood that the exemplary embodiments are illustrative and not restrictive of the invention, the scope of which is defined in the appended claims, and that all modifications that come within the meaning and range of equivalency of the claims are intended to be included therein.

What is claimed is:

1. An apparatus for locating a fault condition between first and second conductors disposed adjacent to one another, each conductor having a length L, said fault condition being a short or a high impedance leakage path between said conductors, comprising:
   (a) means for grounding one end of said first conductor;
   (b) means for applying a control signal to said first conductor such that a first voltage $V_a$ exists between the ends of the first conductor, and thereupon a second voltage $V_b$ exists between said second conductor and ground potential, there being a path to said second conductor through the fault condition;
   (c) voltage detector means selectively connectable to the ends of said first conductor for providing a signal $E_a$ which is representative of said first voltage $V_a$, said voltage detector means being further selectively connectable between said second conductor and ground potential for providing a signal $E_b$ which is representative of said second voltage $V_b$;
   (d) means for selectively connecting said voltage detector means to the ends of said first conductor and between said second conductor and ground potential;
   (e) data input means for providing a signal $E_L$ representative of the length L of said conductors; and
   (f) processor means responsive to said voltage detector means and said data input means for processing said $E_a$, $E_b$ and $E_L$ signals to provide a signal $E_D$ which is representative of the distance D between said fault condition and the grounded end of said first conductor said distance D being defined by the relationship:

$$D = (V_b/V_a)L.$$

2. An apparatus as recited in claim 1 which further comprises visual display means responsive to said data input means and said processor means for displaying the respective L and D values.

3. An apparatus as recited in claim 1 wherein said data input means comprises a keyboard for entering the value L into the apparatus.

4. An apparatus for locating a fault condition between first and second conductors disposed adjacent to one another, each conductor having a length L and a per unit length resistance R, said fault condition being a short or a high impedance leakage path between said conductors, comprising:
   (a) means for grounding one end of said first conductor;
   (b) means for applying a D.C. current source to said first conductor such that a current I flows through said first conductor and such that a first voltage $V_a$ exists between the ends of the first conductor, and thereupon a second voltage $V_b$ exists between said second conductor and ground potential, there being a path to said second conductor through the fault conductor;
   (c) voltage detector means selectively connectable to the ends of said first conductor for providing a signal $E_a$ which is representative of said first voltage $V_a$, said voltage detector means being further selectively connectable between said second conductor and ground potential for providing a signal $E_b$ which is representative of said second voltage $V_b$;
   (d) means for selectively connecting said voltage detector means to the ends of said first conductor and between said second conductor and ground potential;
   (e) first data input means for providing a signal $E_I$ which is representative of the value of said current I, and a signal $E_R$ which is representative of the value of said per unit length resistance R;
   (f) first processor means responsive to said first data input means and said voltage selector means for processing said $E_I$, $E_R$ and $E_a$ signals and for providing a signal $E_L$ which is representative of the length L of said conductors, said length L being defined by the following relationship:

$$L = (V_a/IR)$$

(g) visual display means responsive to said processor means for displaying the value of said length L;

(h) second data input means for providing said $E_L$ signal; and (i) second processor means responsive to said second data input means and said voltage detector means for processing said $E_L$, $E_a$ and $E_b$ signals and providing a signal $E_D$, which is representative of the distance D between said fault condition and the grounded end of said first conductor, said distance D being defined by the relationship:

$$D = (V_B/V_a)L.$$

5. An apparatus as recited in claim 4 wherein said visual display means is further responsive to said second data input means and said second processor means for displaying the respective L and D values.

6. An apparatus as recited in claim 4 wherein said first and second data input means comprises keyboard means for entering the values L, R and I into the apparatus.

7. An apparatus for locating an open fault condition in a first conductor which is disposed adjacent to a second reference conductor, each of said first and second conductors having a length L', said first conductor including first and second spaced apart conductor portions disposed on either side of said open fault, comprising:

(a) means for grounding said second conductor;
(b) means for applying an A.C. voltage source to the ends of said first conductor;
(c) voltage detector means selectively connectable between one end of said first conductor and ground potential for providing a signal $e_a$ representative of a first voltage $v_a$ existing between said first conductor portion and said second conductor, said voltage detector means being further selectively connectable between the other end of said first conductor and ground potential to provide a signal $e_b$ representative of a second voltage $v_b$ existing between said second conductor portion and said second conductor;
(d) data input means for providing a signal $e_{L'}$ representative of the length L' of said conductors; and
(f) processor means responsive to said voltage detector means and said data input means for processing said $e_a$, $e_b$ and $e_{L'}$ signals to provide a signal $e_{D'}$ representative of the distance D' between said fault condition and the end of the second portion of said first conductor farthest from the fault, said distance D' being defined by the relationship:

$$D' = (v_a/v_a + v_b)L'.$$

8. An apparatus as recited in claim 7 wherein said data input means comprises a keyboard for entering the value L' into the apparatus.

9. An apparatus for locating a fault condition in a cable having first and second conductors disposed adjacent to one another and each having a length L comprising:

(a) voltage detector means
(b) means for locating a short or high impedance leakage path between said first and second conductors including:
  i. means for grounding one end of said first conductor;
  ii. means for applying a current source to the ends of said first conductor;
  iii. means for selectively connecting said voltage detector means to the ends of said first conductor to provide a signal $E_a$ which is representative of a first voltage $V_a$ existing between the ends of said first conductor and for selectively connecting said voltage detector means between said second conductor and ground potential to provide a signal $E_b$ which is representative of a second voltage $V_b$ existing between said second conductor and ground, said second voltage $V_b$ being caused by said short or high impedance leakage path between said first and second conductors;

(c) means for locating an open fault condition in said first conductor, said first conductor having first and second spaced apart conductor portions disposed on either side of said open fault, including:
  i. means for grounding the end of said second conductor which is closest to the second conductor portion of said first conductor;
  ii. means for applying an A.C. voltage source to the ends of said first conductor;
  iii. means for selectively connecting said voltage detector means between one end of said first conductor and said second conductor to provide a signal $e_a$ representative of a first voltage $v_a$ existing between said first conductor portion and said second conductor and for selectively connecting said voltage detector means between the other end of said first conductor and said second conductor to provide a signal $e_b$ representative of a second voltage $v_b$ existing between said second conductor portion and said second conductor;

(d) data input means for providing a signal $E_L$ representative of the length L of said conductors;
(e) means for selectively operating either said short or high impedance path locating means or said open fault locating means; and
(f) processor means responsive to said voltage detector means and said data input means for processing said $E_a$, $E_b$, $e_a$, $e_b$ and $E_L$ signals to provide a signal $E_D$ representative of the distance D from the fault to the respective grounded conductor end, said distance D being defined by the relationships:

$$D = (v_b/v_a)L$$

when the fault is a short or high impedance leakage path between the first and second conductors, and $$D = (v_a/v_a + v_b)L$$

when the fault is an open fault condition in said first conductor.

10. An apparatus as recited in claim 9 wherein said current source is a D.C. current source.

11. An apparatus as recited in claim 9 which further comprises visual display means responsive to said data input means and said processor means for selectively displaying said L and D values.

12. A method for locating a fault condition between first and second conductors disposed adjacent to one another, each conductor having a length L, said fault condition being a short or a high impedance leakage path between said conductors, comprising the steps of:

(a) grounding one end of said first conductor;
(b) applying a current source to the ends of said first conductor;

(c) detecting a first voltage $V_a$ existing between the ends of said first conductor;

(d) providing a signal $E_a$ representative of said first voltage $V_a$;

(e) detecting a second voltage $V_b$ existing between said second conductor and ground potential;

(f) providing a signal $E_b$ representative of said second voltage $V_b$;

(g) providing a signal $E_L$ representative of the length L of said conductors; and (h) processing said $E_a$, $E_b$ and $E_L$ signals to provide a signal $E_D$ which is representative of the distance D between said fault condition and the grounded end of said first conductor said distance D being defined by the relationship:

$$D=(V_b/V_a)L.$$

13. A method for locating an open fault condition in a first conductor which is disposed adjacent to a second reference conductor, each of said first and second conductors having a length $L'$, said first conductor including first and second spaced apart conductor portions disposed on either side of said open fault, comprising the steps of:

(a) grounding said second conductor;

(b) applying an A.C. voltage source to the ends of said first conductor;

(c) detecting a first voltage $v_a$ existing between said first conductor portion and said second conductor;

(d) providing a signal $e_a$ which is representative of said first voltage $v_a$;

(e) detecting a second voltage $v_b$ existing between said second conductor portion and said second conductor;

(f) providing a signal $e_b$ which is representative of said second voltage $v_b$;

(g) providing a signal $e_{L'}$ representative of the length $L'$ of said conductors; and (h) processing said $e_a$, $e_b$ and $e_{L'}$ signals to provide a signal $e_{D'}$ representative of the distance $D'$ between said fault condition and the end of the second portion of said first conductor farthest from the fault, said distance $D'$ being defined by the relationship:

$$D'=(v_a/v_a+v_b)L'.$$

* * * * *